United States Patent [19]

Mori et al.

[11] Patent Number: 5,101,244
[45] Date of Patent: Mar. 31, 1992

[54] SEMICONDUCTOR SCHOTTKY DEVICE WITH PN REGIONS

[75] Inventors: Mutsuhiro Mori; Yasumiti Yasuda; Naoki Sakurai, all of Hitachi; Hidetoshi Arakawa, Kitaibaraki; Hiroshi Owada, Hitachi, all of Japan

[73] Assignees: Hitachi, Ltd., Tokuo; Hitachi Haramachi Semiconductor Ltd., Hitachi, both of Japan

[21] Appl. No.: 660,872

[22] Filed: Feb. 26, 1991

[30] Foreign Application Priority Data

Feb. 28, 1990 [JP] Japan .................. 2-045434

[51] Int. Cl.$^5$ ............................ H01L 29/48
[52] U.S. Cl. ...................... 357/15; 357/52; 357/53; 357/13; 357/48
[58] Field of Search .......... 357/15, 13, 15 R, 15 V, 357/15 P, 15 M, 30 C, 41, 52, 43, 52 D, 48, 49, 50, 53

[56] References Cited

U.S. PATENT DOCUMENTS 4,862,229  8/1989  Mundy .................. 357/15

FOREIGN PATENT DOCUMENTS 56-35473   4/1981  Japan ................ 357/15 X
5860577    4/1983  Japan .
58-114468  7/1983  Japan ................ 357/15 X
8188560    5/1986  Japan ................ 357/15 X
2-105465   4/1990  Japan ................ 357/15 X

OTHER PUBLICATIONS

3rd European Conference on Power Electronics and Applications, Oct. 9–12, 1989, pp. 611–616, Schlangenotto et al., "Improved Reverse Recovery of Fast Power Diodes Having a Self-Adjusting P Emitter Efficiency".

Baliga et al., "The Merged P-In Schottky (MPS) Rectifier: A High-Voltage, High Speed Power Diode", IEEE International Electron Devices Meeting *IEDM* 87, pp. 658–661.

*Primary Examiner*—William Mintel
*Attorney, Agent, or Firm*—Antonelli, Terry Stout & Kraus

[57] ABSTRACT

A semiconductor device has a first diode having a pn junction and a second diode having a combination of a Schottky barrier and a pn junction in a current-passing direction provided side by side in a direction perpendicular to the current-passing direction. When a forward current with a current density $J_F$ is passed into the second diodes, the relation $$1.00 \leq \frac{q}{kT} \frac{\partial V_F}{\partial (\ln J_F)} \leq 1.15$$

is established in a forward voltage $V_F$ range of 0.1 (V) to 0.3 (V), where k represents the Boltzmann constant, T represents the absolute temperature, and q represents the quantity of electron charges. The first diode is constituted by a first semiconductor region of one conductive type and a second semiconductor region of the other conductive type provided so as to be adjacent to the first semiconductor region to form a pn junction, so as to be in ohmic contact with one main electrode, and so as to have an impurity concentration higher than that of the first semiconductor region, and the second diode is constituted by the first semiconductor region of the one conductive type and a third semiconductor region of the other conductive type provided so as to be adjacent to the first semiconductor region to form a pn junction, so as to be in contact through a Schottky barrier with the one main electrode, and so as to have an impurity concentration higher than the first semiconductor region.

25 Claims, 7 Drawing Sheets

SEMICONDUCTOR SCHOTTKY DEVICE WITH PN REGIONS

BACKGROUND OF THE INVENTION

The present invention relates to a high-speed diode having a small reverse recovery current and a device produced by application of the diode. In particular, it relates to a semiconductor device and a method of producing the same, in which it is possible to make a diode high in withstanding voltage, high in reliability and simple in manufacturing.

FIG. 9 shows current and voltage waveforms of a general diode in which the state thereof changes from a current conductive state in the forward direction (hereinafter referred to as "forward current-conductive state") into a current blocking state in the reverse direction (hereinafter referred to as "reverse current-blocking state"). When a current with a current density $J_F$ is passed in the forward direction and then a voltage $V_R$ is instantaneously applied in the reverse direction, a reverse recovery current flows. It is necessary to reduce the peak value of the reverse recovery current density $J_{RP}$ at this time to be as small as possible, because a power loss is generated proportionally to the peak value of the current density $J_{RP}$. Further, the peak value of the current density $J_{RP}$ acting as a noise source becomes a cause of a faulty operation in a circuit using the diode, in particular, an integrated circuit using the diode. From this point of view, a diode structure for reducing the current density $J_{RP}$ as shown in FIG. 10 has been discussed in the papers of IEEE International Electron Devices Meeting, pages 658–661, 1987. In this structure, a p layer 113 separated into parts is formed in an n− layer 112 which is formed on one surface of an n+ substrate 111 by a technique such as a crystal growing technique. An electrode 121 is disposed so as to be in ohmic contact with the p layer 113 and forms a Schottky junction with exposed portions of the n− layer 113 where the p layer 113 is not formed, that is, exposed portions of the n− layer 112 which are respectively disposed between the separation parts of the p layer 113. The electrode 121 is formed so as to extend onto an oxidized film 131 in the peripheral portions thereof, so that the electrode 121 serves as a field plate for relaxing the electric field in the peripheral portions thereof. An opposite electrode 122 is disposed so as to be in low ohmic contact with the n+ layer 111. When a current is passed through the diode from the electrode 121 to the electrode 122, holes are injected through the pn junction portions, that is, from the p layer 113 to the n− layer 112, so that excess carriers are accumulated in the n− layer 112. However, holes are little injected through the Schottky junction portions from the electrode 121 to the n− layer 112. Accordingly, the concentration of carriers accumulated in the vicinity of the interface between the pn junction and the Schottky junction is reduced compared with the conventional diode having only pn junctions. Consequently, as is obvious from FIG. 9, the diode of FIG. 10 has an advantage in that it is effective for reduction of the current density $J_{RP}$, because the current density $J_{RP}$ at the instance when the reverse bias $V_R$ is applied is produced by the carriers accumulated in the vicinity of the pn junctions. Furthermore, in a reverse current-blocking state, because a depletion layer extending from the pn junctions which are formed between the p layer 113 and the n− layer 112 and disposed on the both sides of the Schottky junction reaches through under the Schottky junction so that the electric field applied to the Schottky junction can be relaxed. Accordingly, the diode has another advantage in that a leakage current can be reduced compared with the conventional diode having only Schottky junctions.

On the other hand, a diode structure for reducing the current density $J_{RP}$ as shown in FIG. 11 has been disclosed in Japanese Patent Unexamined Publication No. Sho-58-60577. The diode of FIG. 11 is different from the diode of FIG. 10 in that a p layer 114 having a carrier concentration lower than that of the p+ layer 113 is provided on the exposed surface portions of the n− layer 112 which are located between separated parts of the p+ layer 113. The electrode 121 is disposed so as to be in ohmic contact with the P+ layer 113 and the P layer 114. Accordingly, because a current is mainly passed through the pn junctions between the p layer 114 and the n− layer 112 which is small in diffused potential when the diode is in a forward current-conductive state, the diode has an advantage in that a forward voltage drop can be reduced compared with the diode having only the pn junctions between the p+ layer 113 and the n− layer 112. Furthermore, because the carrier concentration in the p layer 114 is low, the quantity of carriers injected from the p layer 114 can be reduced. Accordingly, the diode has another advantage in that the current density $J_{RP}$ can be reduced. Furthermore, because a metal-semiconductor interface such as a Schottky junction is not used, the diode is little affected by factors such as contamination at the semiconductor surface. Accordingly, the diode has a further advantage in that the diode has stable characteristics. Of course, the diode of FIG. 11 has the same effect as the diode of FIG. 10 in that the electric field applied to the pn junctions between the p layer 114 and the n− layer 112 can be relaxed by the depletion layer extending from both the deep p+ layer 113 and the n− layer 112 to thereby reduce a leakage current.

SUMMARY OF THE INVENTION

The diode as shown in FIG. 10 has a problem in that, by the bonding of a wire 141 to the electrode 121, a leakage current is increased to deteriorate the withstanding voltage. The cause of this problem is conjectured as follows.

When the wire 141 is bonded to the electrode 121, a defect may be produced in an interface between the electrode 121 and the n− layer 112 by the pressure applied to the electrode 121 and the wire 141. Because the defect forms a recombination center, electrons in a conduction band flow into the defect so that a leakage current increases. In particular, because the thickness of the Schottky barrier decreases as the strength of the electric field applied to the interface between the electrode 121 and the n− layer 112 increases in a reverse bias state, the probability that electrons transit into the recombination center in the form of a tunnel current increases. It happens therefore that the leakage current increases remarkably and, accordingly, the withstanding voltage deteriorates.

On the other hand, the diode as shown in FIG. 11 has a problem in that the current density $J_{PR}$ becomes larger than that of the diode of FIG. 10 because there exists carrier injection from the p layer 114. Although it is possible to reduce the carrier concentration in the p layer 114 to thereby reduce the current density $J_{PR}$, it has a disadvantage in that the withstanding voltage deteriorates when the carrier concentration of the p layer 114 is too small. The presumed cause of the disadvantage is as follows. When the carrier concentration in the p layer 114 is too small, a depletion layer is punched through the electrode 121 so that the withstanding voltage deteriorates. The diode of FIG. 11 has another problem in that the steps of the producing process for forming the p layer 114 are increased in number compared with the diode of FIG. 10.

As described above, because there is no consideration in the prior art upon the deterioration of the withstanding voltage in a structure to attain a small current density $J_{RP}$, a problem arises in that reduction of the current density $J_{RP}$ is incompatible with security of the withstanding voltage.

An object of the present invention is therefore to provide a semiconductor device which has a small current density $J_{RP}$ and a stable withstanding voltage, which can be produced easily, which and is excellent in stability, as well as to provide a method of producing the same.

To attain the foregoing object, the semiconductor device according to the present invention has a feature that a first diode having a pn junction and a second diode having a combination of a Schottky barrier and a pn junction in a current-conductive direction are arranged in a direction perpendicular to the current-conductive direction. More specifically, the feature is in that when a forward current with a current density $J_F$ is passed into the second diode, the relation $$1.00 \leq \frac{q}{KT} \frac{\partial V_F}{\partial (\ln J_F)} \leq 1.15$$

is established in a forward voltage $V_F$ range of 0.1 (V) to 0.3 (V), where k represents the Boltzmann constant ($\approx 1.38 \times 10^{-23}$ J/K), T represents the absolute temperature, and q represents the quantity of electron charges ($\approx 1.6 \times 10^{-19}$ C). As a specific example of the configuration thereof, the first diode is constituted by a first semiconductor region of one conductive type and a second semiconductor region of the other conductive type which is provided so as to be adjacent to the first semiconductor region to form a pn junction therebetween, so as to be in ohmic contact with one main electrode, and so as to have an impurity concentration higher than that of the first semiconductor region, and the second diode is constituted by the first semiconductor region of the one conductive type and a third semiconductor region of the other conductive type which is provided so as to be adjacent to the first semiconductor region to form a pn junction therebetween, so as to be in contact through a Schottky barrier with the one main electrode, and so as to have an impurity concentration higher than that of the first semiconductor region. In this case, it is preferable that the third semiconductor region has the carrier concentration of not larger than $1 \times 10^{14}$ cm$^{-2}$ and has a thickness of not larger than 10 nm. As a whole configuration of the semiconductor device, it is ideal that the second diodes are enclosed by the first diodes respectively.

Furthermore, in order to attain the foregoing object, the method of producing a semiconductor device according to the present invention comprises: a first step of forming, on one main surface of a first semiconductor region of one conductive type, a second semiconductor region of the other conductive type to extend from the one main surface into the inside of the first semiconductor region so as to have a plurality of small areas and an annular area surrounding the small areas when seen from the one main surface and so as to have an impurity concentration higher than the first semiconductor region; a second step of forming, on the one main surface, a metal layer containing impurities of the other conductive type on the second semiconductor region and portions of the first semiconductor region which are exposed among the small and annular areas of the second semiconductor region; and a third step of bringing the metal metallic layer into ohmic contact with the second semiconductor region and diffusing impurities of the metal layer into the first semiconductor region to form a third semiconductor region of the other conductive type which is thinner than the second semiconductor region, and performing a heat treatment so as to form a Schottky barrier between the metallic layer and the third semiconductor region.

Preferably, the above-mentioned metal layer is constituted by a material containing aluminum as a main component, and the heat treatment in the abovementioned third step of carried out at a temperature in a range of 430 to 577° C.

In the present invention, a pn junction is formed under a Schottky barrier. Accordingly, because the pn junction can prevent the increase of a leakage current caused by a tunnel current or the like even when a defect at wire bonding or the like arises in a Schottky barrier interface, the withstanding voltage can be prevented from lowering.

Furthermore, because the injection of holes into the n− layer from the p layer under the Schottky barrier can be suppressed by establishing the value of n to be a range of $1.00 \leq n \leq 1.15$, the excess carriers accumulated on the pn junction interface can be reduced and, accordingly, the reverse recovery current density $J_{RP}$ can be reduced.

Furthermore, because a p layer can be formed under the Schottky barrier by making an electrode contain p-type impurities and diffusing the p-type impurities into a semiconductor, there is no necessity of providing a new process for forming a p layer by ion implantation or other technique and, accordingly, the production is made easy.

In the semiconductor device according to the invention, not only a reverse recovery current can be reduced to prevent the deterioration of the withstanding voltage but also the producing process can be simplified. Consequently, there arise effects of the reduction of noises, the improvement of reliability, the facilitation of production, etc.

DESCRIPTION OF THE PREFERRED EMBODIMENTS

Figure 1A:
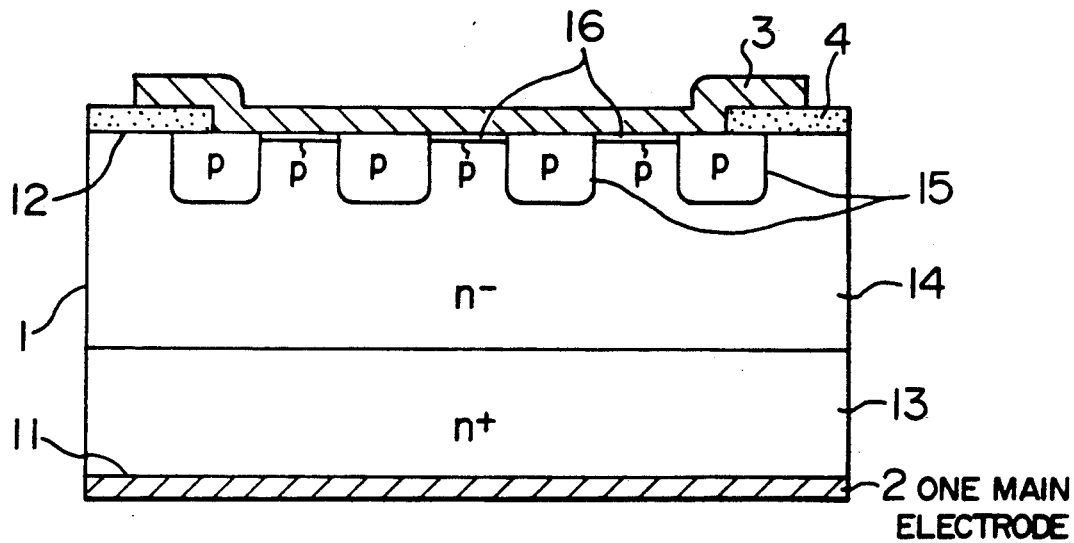
FIGS. 1A and 1B are a sectional view and a plan view of a semiconductor device as an embodiment of the present invention.

Referring to the drawings illustrating embodiments of the invention, the present invention will be described in detail hereunder.

Figure 1B:
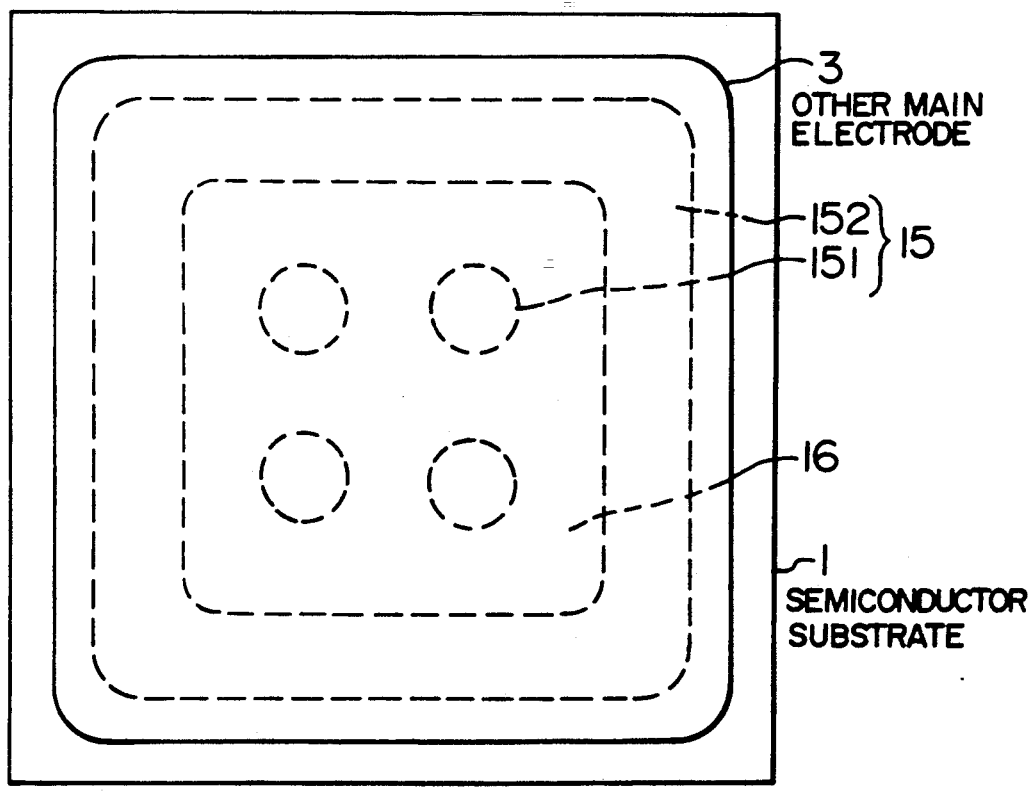

FIGS. 1A and 1B are a sectional view and a plan view of an embodiment 6 of the semiconductor device according to the present invention. In FIGS. 1A and 1B, the reference numeral 1 designates a semiconductor substrate having a pair of main surfaces 11 and 12 disposed in opposition to each other. The semiconductor substrate 1 is composed of an n+ layer 13 disposed so as to be adjacent to one main surface 11, an n− layer 14 disposed so as to be adjacent to both the n+ layer 13 and the other main surface 12 and having an impurity concentration lower than that of the n+ layer 13, a p layer 15 extending from a plurality of selected portions of the other main surface 12 into the inside of the n− layer 14 and having an impurity concentration higher than that of the n− layer 14, and a p layer 16 extending from the other main surface 12 into the inside of the n− layer 14 so as to be located between separated portions of the p layer 15 and having an impurity concentration higher than that of the n− layer 14 and having a depth thinner than that of the p layer 15. The p layer 15 is composed of a plurality of small areas 151, and an annular area 152 for surrounding the small areas 151. The reference numeral 2 designates one main electrode which is provided so as to be in ohmic contact with the n+ layer 13 at the one main surface 11, 3 designates the other main electrode which is provided so as to be in ohmic contact with the p layer 15 at the other main surface 12 and which forms a Schottky barrier between the other main electrode 3 and the p layer 16, and 4 designates an oxidized film formed so as to partially cover the n− layer 14 and the p layer 15 in the peripheral portions of the other main surface 12. The other main electrode 3 extends so as to partially cover the oxidized film 4. Thus, between the main surfaces 11 and 12 in pair, there is provided a diode structure composed of a first diode which is constituted by the n+ layer 13, the n− layer 14 and the p layer 15, and a second diode which is constituted by the n+ layer 13, the n− layer 14, the p layer 16 and the Schottky barrier.

Figure 2A:
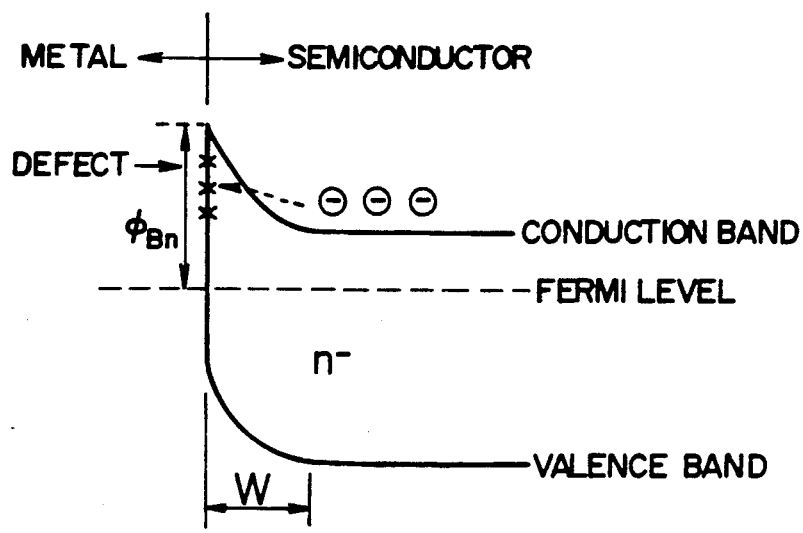
FIGS. 2A and 2B and FIG. 3 are explanatory views for explaining the effect of the invention.
Figure 2B:
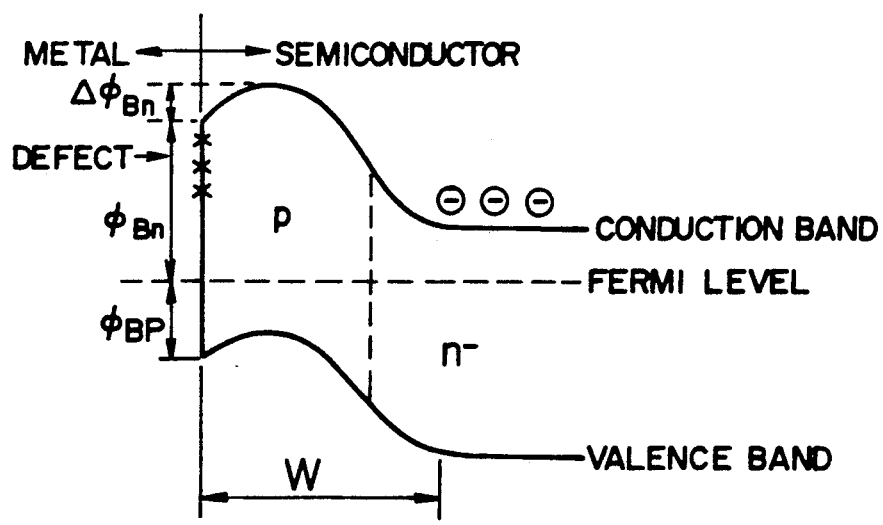
Figure 10:
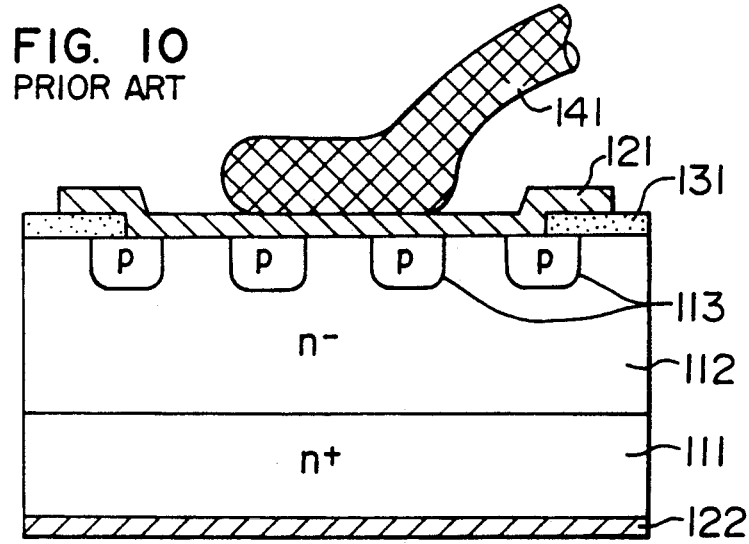
FIGS. 10 and 11 are sectional views of conventional semiconductor devices.
Figure 11:
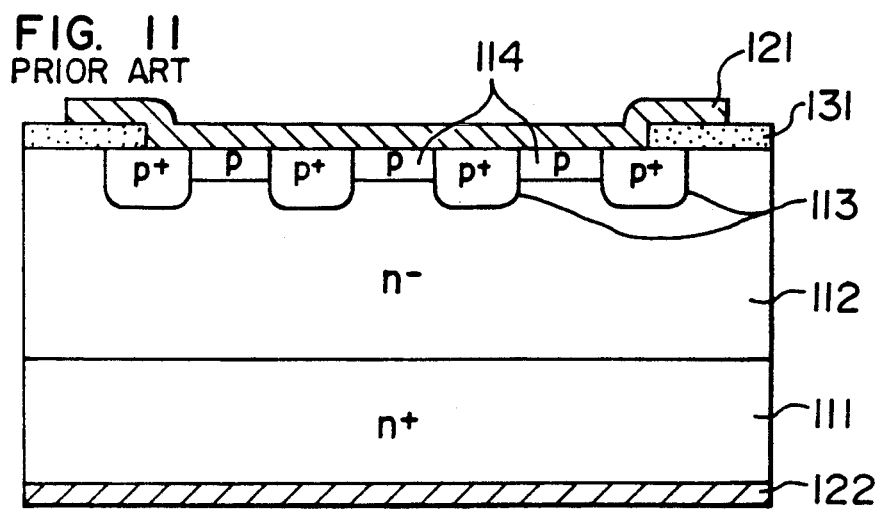

The embodiment of the present invention as illustrated in FIGS. 1A and 1B is different from the conventional example shown in FIG. 11 in that a Schottky barrier is provided between the p layer 16 and the main electrode 3. The effect of the invention will be described with reference to FIGS. 2A and 2B. The diagram of Fig. 2A shows the energy band structure of a Schottky barrier region formed between the electrode 121 and the n− layer 112 in the conventional example of FIG. 10. The diagram of FIG. 2B shows the energy band structure of a Schottky barrier region formed between the main electrode 3, the p layer 16 and the n− layer 14 in the invention of FIG. 1A. In the conventional structure shown in the diagram of FIG. 2A, it is supposed that when a defect is produced in the Schottky barrier interface by wire bonding or the like as described previously, electrons in a conduction band in a reverse bias state flow into the recombination center produced by the defect to thereby increase a leakage current and, accordingly, the withstanding voltage deteriorates. In the embodiment of the present invention shown in diagram of FIG. 2B, on the other hand, the probability that electrons in a conduction band transit into the defect in the form of a tunnel current can be remarkably reduced even when a defect is produced in the Schottky barrier interface because the width W of the barrier is enlarged by the p layer 16. When, for example, the width of the p layer 16 exceeds 100 Å, there is little transition of electrons by tunneling effect. Accordingly, the leakage current is reduced to attain an improvement in the withstanding voltage. Furthermore, because a Schottky barrier is formed between the p layer 16 and the main electrode 3, the invention has an advantage in that the deterioration of the withstanding voltage as in the conventional diode of FIG. 11 is prevented even when the depletion layer caused by the pn junction is punched through to the main electrode 3. Further, the height $\phi_{Bn}$ of the barrier against electrons, being innate in metal, can be increased by $\Delta\phi_{bn}$ by the p layer 16. Accordingly, the leakage current flowing over the barrier $(\phi_{bn}+\Delta\phi_{bn})$ in a reverse current blocking state can be also reduced. For example, the leakage current at 150° C. can be reduced by about the order of one figure by increasing the $\Delta\phi_{bn}$ by 0.1 eV. Because the P layer 15 is formed more deeply than the p layer 16, it is a matter of course that there arises an effect that the electric field applied to the pn junction of the p layer 15 can be relaxed by the depletion layer extending from the pn junctions of the p layer 15. Further, the supply of holes into the p layer 16 can be suppressed by the barrier $\phi_{BP}$ against holes in the p-type Schottky barrier. As described previously, in the diode of FIG. 11 in which the p layer 114 is in ohmic contact with the electrode 121, holes are supplied from the electrode 121 to the p layer 114 and then injected from the p layer 114 into the n− layer 112. On the contrary, in the diode 1 of FIGS. 1A and 1B, the supply of holes to the p layer 16 is suppressed by $\phi_{BP}$, so that the injection of holes from the p layer 16 into the n− layer can be reduced. As a result, carriers accumulated in the vicinity of the pn junctions can be reduced, so that the current density $J_{RP}$ can be reduced. In the more preferred p layer 16, the current density $J_{RP}$ can be reduced more remarkably because the injection of holes can be reduced extremely be depleting the p layer on the basis of built-in potentials both the pn junction and the Schottky junction.

In addition, because the p layer 15 and the n− layer 14 are more biased in the forward direction by the increase $\Delta\phi_{bn}$ of the height of the barrier due to the p layer 16, there arises an effect that the forward voltage drop can be reduced. That is, as described previously, in the diagram of FIG. 2A, electrons injected from the n+ layer 13 are mainly passed through the Schottky junction to make it difficult to promote the injection of holes from the p layer efficiently. On the contrary, in the diagram of FIG. 2B, the p layer 15 and the n− layer 14 are more biased in the forward direction by the higher voltage corresponding the value $\Delta\phi_{bn}$ to thereby increase the quantity of hole injection from the p layer 15, so that the forward voltage drop in the diode can be reduced.

Figure 3:
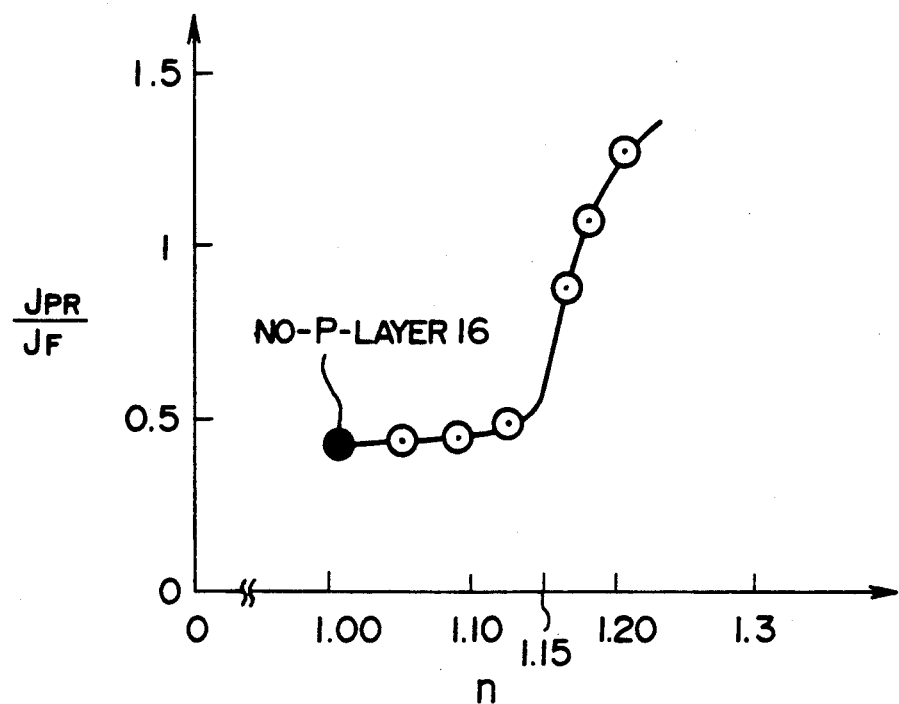

FIG. 3 shows a result of an experiment in which the electrical characteristic of the diode has been examined in detail at a room temperature in the case where various types of p layers 16 are applied to the diode 1 of FIG. 1. The graph of FIG. 3 shows the relationship between the value of n (the axis of abscissas) expressed by the formula $$n = \frac{kT}{q} \frac{\partial V_F}{\partial (\ln J_F)}$$

and the value of $J_{RP}/J_F$ which is a ratio of a reverse recovery current density to a forward current density (the axis of ordinates) in a region in which a linear relationship exists between the value of a forward voltage $V_F$ which is in a range of about 0.1 to about 0.3 V and the value of $\ln J_F$ when a current with the current density $J_F$ is made to flow through the diode in the forward direction. The relationship shown in the graph of FIG. 3 shows that the majority carriers occupy the main current as the value of n approaches to 1, and that the current used for recombination with injected minority carriers becomes large as the value of n approaches to 2. As a result of examination of the ratio $J_{RP}/J_F$ of the reverse recovery current density $J_{RP}$ to the forward current density $J_F$, it has been found that the relationship of FIG. 3 is established. It has been found that the ratio $J_{RP}/J_F$ can be reduced by establishing the value of n to be in a range of 1.00 to 1.15. This shows that the reverse recovery current density $J_{RP}$ can be reduced by reducing the injection of the minority carriers (that is, by reducing the value of n) even when the p layer 16 is provided.

In respect to the condition for the p layer 16, it is preferable that the quantity of injected ions is not larger than about $1 \times 10^{14}$ cm$^{-2}$ in the case where the p layer 16 is formed by implantation of B (boron) ions. If the quantity of injected ions is larger than $1 \times 10^{14}$ cm$^{-2}$, the relation between the p layer 16 and the main electrode 2 approaches to ohmic contact and, at the same time, the concentration of the p layer 16 increases, so that holes are injected easily from the p layer 16 into the n— layer to thereby increase the reverse recovery current density $J_{RP}$.

Figure 4A:
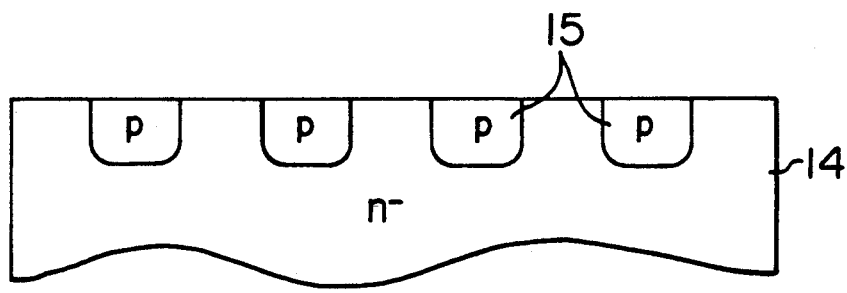
FIGS. 4A through 4C are sectional views showing a method for producing a semiconductor device according to the invention.
Figure 4B:
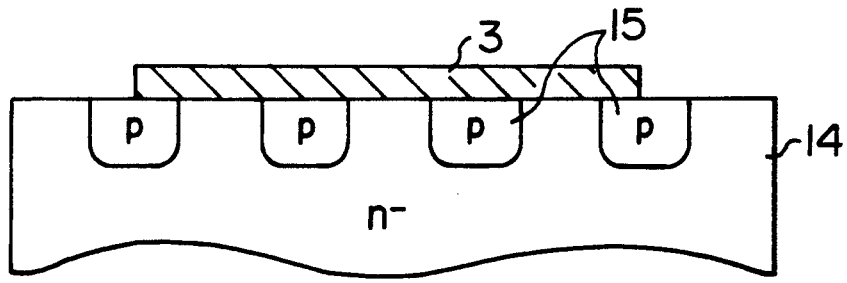
Figure 4C:
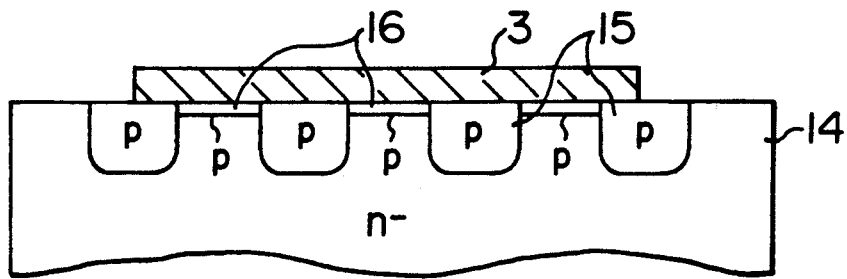

FIGS. 4A through 4C show a method of producing a semiconductor device as a preferred embodiment of the present invention. First, an n— layer 14 having a specific resistance and a thickness necessary for attaining desired a withstanding voltage is prepared. From one surface of the n— layer 14, p-type impurities are partially introduced by ion implantation or diffusion. Here, the p-type impurities are diffused by a heat treatment to a desired depth, for example, 1 to 10 μm in the case of a diode of 600 V, thereby forming a p layer 15 (FIG. 4A). Then, an electrode 3 containing p-type impurities is piled on the surface of the p layer 15 and the surface of the n— layer 14 enclosed by the p layer 15 (FIG. 4B). Here, the p-type impurities in the electrode 3 are diffused into the surface of the n— layer 14 by a heat treatment, thereby forming a p layer 16 (FIG. 4C). By applying the aforementioned technique, it is possible to omit the step of forming the p layer 16 by using such as ion implantation which was necessary in the conventional case of FIG. 11. In this case, because the junction depth of the p layer 16 is very small, that is, not larger than about 100 nm, it is preferable that the final end p layer 15 is connected to the other final end p layer 16 for the double purpose of relaxing the electric field in the periphery and securing the withstanding voltage. In the case where any suitable shape in plan, for example, a stripe shape, a circular shape, a polygonal shape, may be used as the shape of the p layer 15, the effect of the invention can be attained. It is a matter of course that the electrode for forming a Schottky barrier and the electrode for forming an ohmic junction may be formed of different materials and may be short-circuited electrically with each other.

Figure 5:
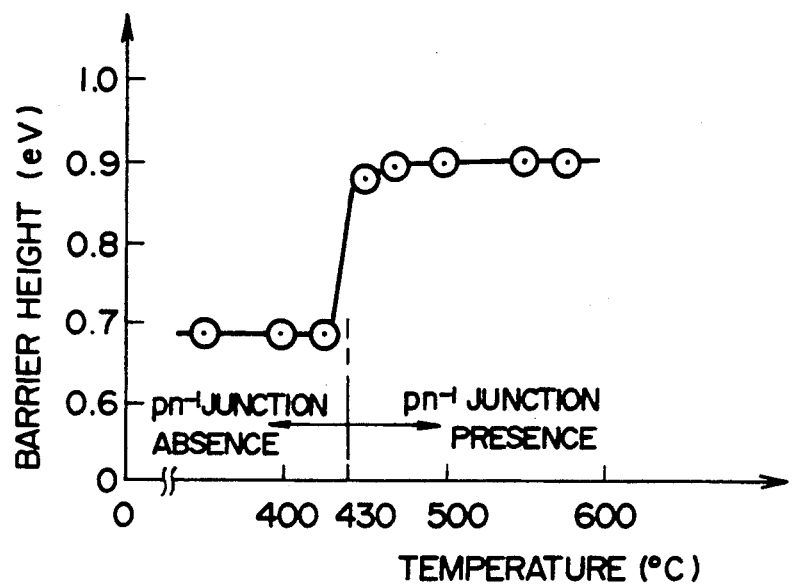
FIG. 5 is an explanatory view showing a producing condition according to the invention.

FIG. 5 shows a result of an experiment for examination of a more preferred example of the electrode 3 in the case where a material containing aluminum is used for the electrode 3. As an experimental result by the inventors, it has been found that the p layer 14 is formed when the temperature for the heat treatment is higher than 430° C. However, if the temperature is made to be not lower than 577° C. which is an eutectic point for aluminum and silicon, there occurs both wire breaking in the electrode 3 and unevenness in the p layer 14 caused by condensation of aluminum. Accordingly, it is not preferable that the temperature for the heat treatment is made to be equal to or higher than the eutectic point. From the result, there arises an effect the silicon-containing aluminum widely used in the semiconductor process can be applied to the electrode 3 and can be applied to the semiconductor producing process. In the case where the amount of silicon added to aluminum is small, that is, in a range of 2 to 3%, the barrier height may be reduced to about 0.79 eV by elution of silicon in a silicon wafer at 550° C. but the barrier height can be increased by 0.1 eV to thereby reduce the leakage current by the order of about one figure compared with the barrier height of 0.69 eV in the case where no pn junction is provided. In this case, the barrier height of Schottky junction annealed at 430–500° C. is about 0.89 eV, 0.1 eV higher than that at 550° C. the leakage current for the 0.89 eV device is still one figure lower than that for the 0.79 eV device.

Figure 6A:
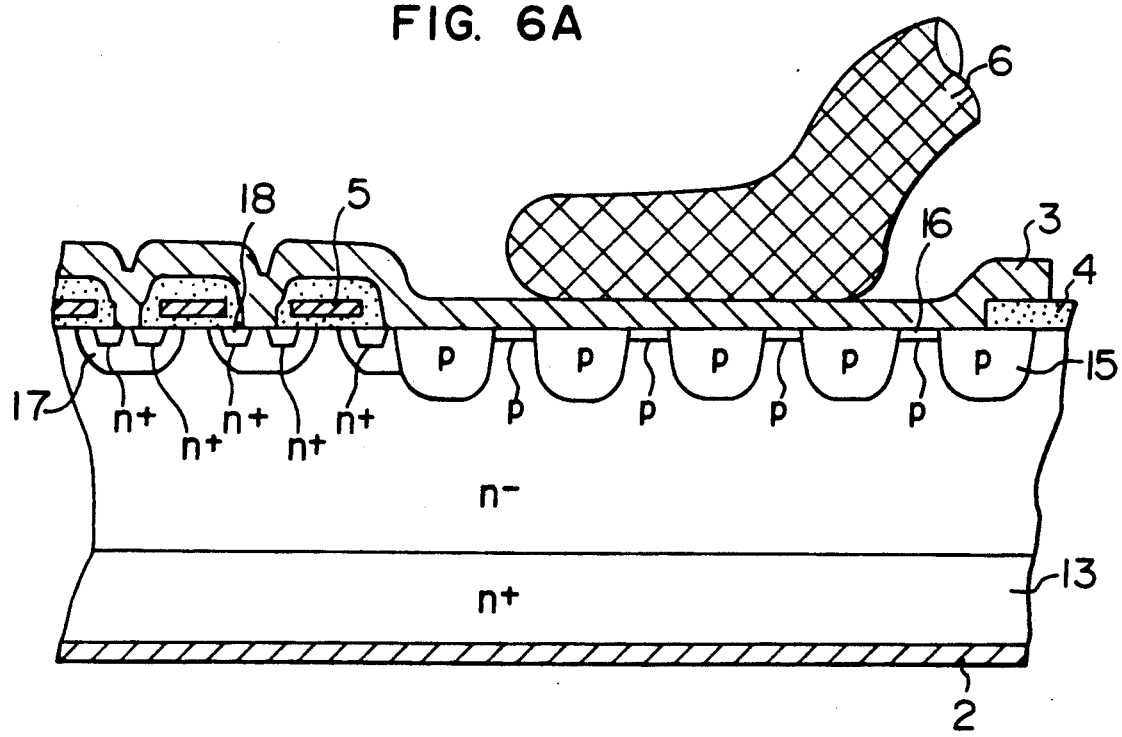
FIGS. 6A, 6B, 7 and 8 are sectional views and a circuit diagram showing applications of the invention.
Figure 6B:
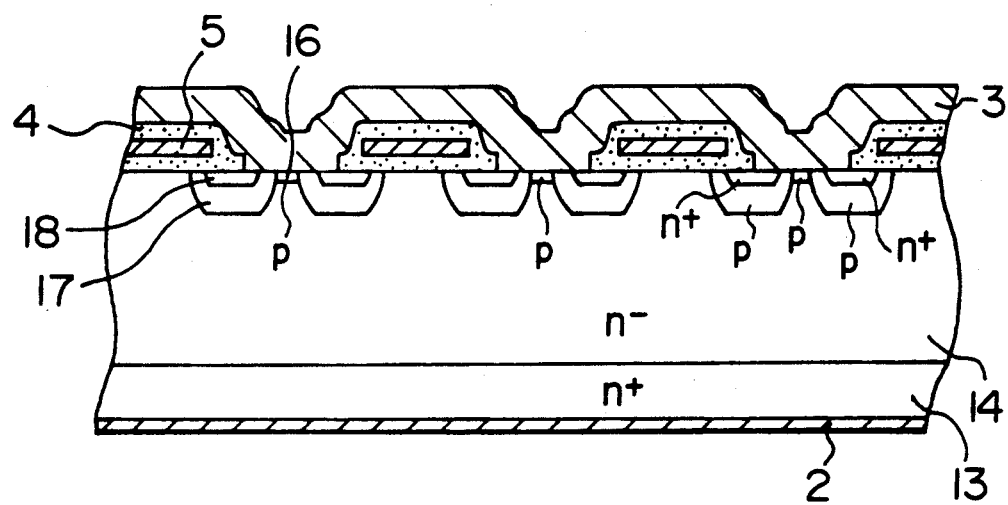

FIGS. 6A and 6B show applications of the present invention in which a power MOSFET and the semiconductor device according to the invention are used in combination. The power MOSFET is composed of a p-type well layer 17 formed in the n— layer 14, an n-type source layer 18 formed in the inside of the well layer 17, an gate electrode 4, and drain and source electrodes formed by extending the electrodes 2 and 3. The reference numeral 6 designates a bonding wire for providing the diode on the electrode 3. As a result, a main current can be passed into the power MOSFET through the built-in diode composed of an n+ layer 13, an n+ layer 14, a p layer 15 and another p layer 16, so that not only the deterioration of the withstanding voltage caused by the bonding of the wire 6 can be prevented but also the reverse recovery current density $J_{RP}$ can be reduced. Further, as shown in FIG. 6B, the semiconductor device according to the present invention may be provided in the electrically conductive region of the power MOSFET. Accordingly, the present invention can be applied to the electrically conductive region occupying a large area in the power MOSFET to form a composite device so that a larger diode current can be taken out. It is a matter of course that the diode according to the present invention may be applied to another transistor having an n+ substrate such as a bipolar transistor to form a composite device.

Figure 7:
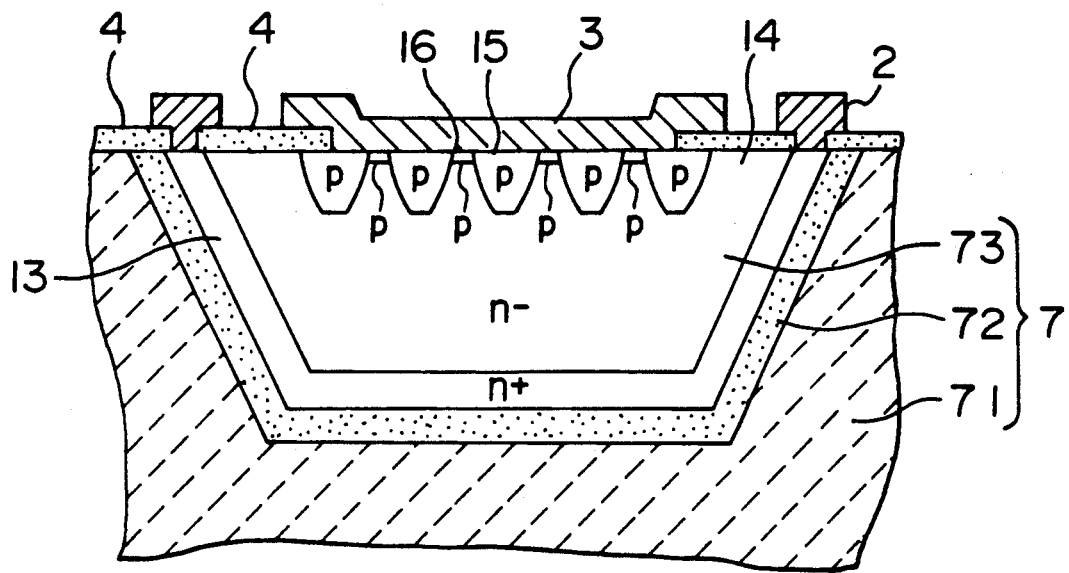

FIG. 7 shows an example in which the present invention is applied to a dielectric isolated substrate 7 used in power ICs and the like. The diode according to the present invention is formed in the inside of a single crystal island 73 formed through an insulating film 72 in a substrate of a multicrystal semiconductor 71. The electrodes 2 and 3 are exposed at one and the same surface. By applying the semiconductor device according to the present invention to a power IC using the dielectric separating substrate, not only a bonding pad can be provided on the electrode 3 but also the reverse recovery current density $J_{RP}$ can be reduced without spoiling the characteristics of other elements of a power IC. Furthermore, because the p layer 16 can be constituted by an electrode containing aluminum as a main component, there is no necessity of addition of a new process.

Figure 8:
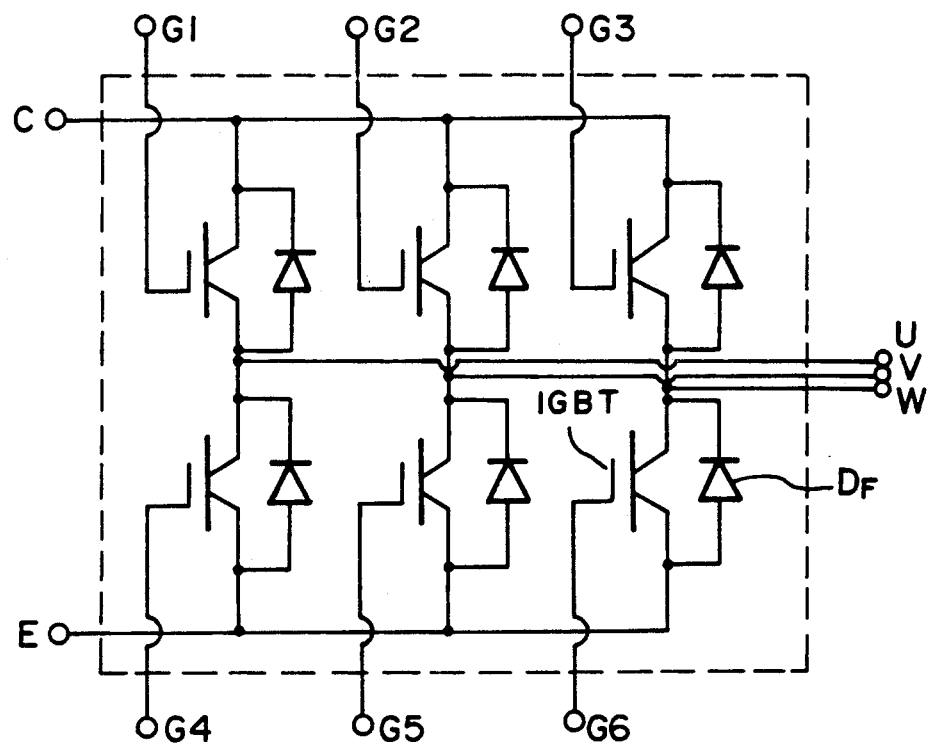
Figure 9:
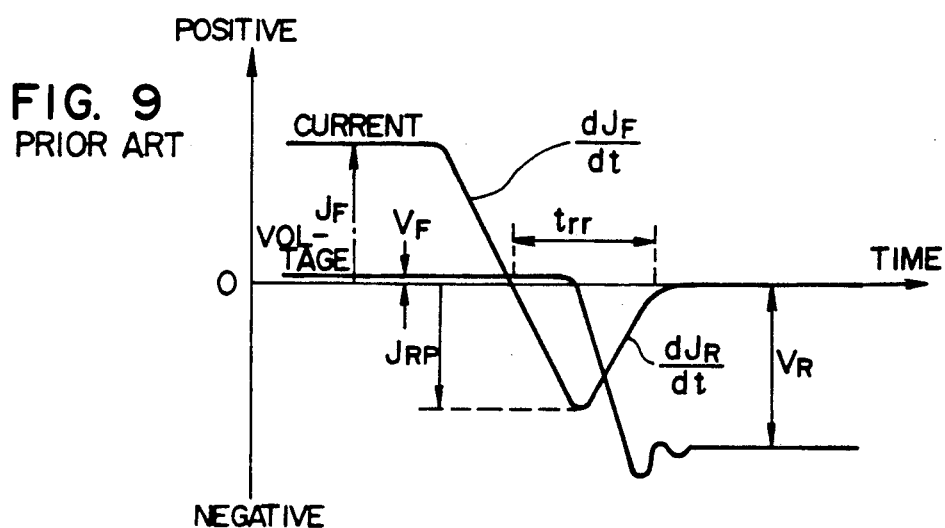
FIG. 9 is an explanatory view for explaining the reverse recovery characteristic of a diode.

FIG. 8 shows an example in which the present invention is applied to a feedback diode $D_F$ included in a transistor module. The circuit shown in FIG. 8 is a three-phase inverter module using IGBT (integrated gate bipolar transistor). In particular, in the module using IGBT which is remarkably improved in high-speed switching, the turning-on speed thereof is so high that when an IGBT connected to an E terminal turns on, a diode $D_F$ connected to a C terminal just above the IGBT is biased reversely so that a reverse recovery current $J_{RP}$ is generated. There arises a disadvantage, therefore, in that the reverse recovery current acts as a noise source to make a gate circuit of an off-state parallel-connected IGBT maloperate to thereby turn on the IGBT. As a result, the C and E terminals are short-circuited, so that the IGBT may be destroyed in the worst case. When the diode according to the invention is applied to the module, the reverse recovery current $J_{RP}$ is so small that not only noise generation can be suppressed to prevent the maloperation of the circuit but also a defect in the withstanding voltage, of the diode requiring a large number of bondings in the module can be reduced to improve the yield thereof.

It is a matter of course that the same effect can be attained in the case the lifetime of the minority of carriers in the semiconductor device according to the present invention may be shortened by a technique such as radiation of electron rays or in the case where the p-type and n-type semiconductor layers in the semiconductor device according to the invention may be replaced by each other.

What is claimed is:

1. A semiconductor device comprising:
    a first semiconductor region of one conductive type having one main surface;
    a second semiconductor region of the other conductive type extending from a plurality of selected portions of said main surface into the inside of said first semiconductor region;
    a third semiconductor region of the other conductive type extending from said main surface into the inside of said first semiconductor region and across adjacent portions of said second semiconductor region, said third semiconductor region having a depth smaller than that of said second semiconductor region;
    a first electrode formed on said main surface so as to form an ohmic junction with said second semiconductor region and form a Schottky junction with said third semiconductor region; and
    a second electrode provided so as to form an ohmic junction with said first semiconductor region.

2. A semiconductor device having:
    a semiconductor substrate having a pair of one and the other main surfaces opposite to each other and having, between said pair of main surfaces, a first semiconductor region of one conductive type being adjacent to said one main surface, a second semiconductor region of one conductive type being adjacent to both said first semiconductor region and said other main surface and having an impurity concentration lower than that of said first semiconductor region, a third semiconductor region of the other conductive type extending from said other main surface into the inside of said second semiconductor region so as to form small areas and an annular area surrounding said small areas when seen from said other main surface and having an impurity concentration higher than that of said second semiconductor region, and a fourth semiconductor region of the other conductive type extending from said other main surface into the inside of said second semiconductor region so as to be located on portions of said second semiconductor region which are exposed among said small and annular areas of said third semiconductor region, said fourth semiconductor region and having a thickness thinner than that of said third semiconductor region and having an impurity concentration lower than that of said third semiconductor region;
    a first electrode provided at said one main surface of said semiconductor substrate so as to be in ohmic contact with said first semiconductor region; and
    a second electrode provided at said other main surface of said semiconductor substrate so as to be in ohmic contact with said third semiconductor region and so as to be in contact through a Schottky barrier with said third semiconductor region.

3. A semiconductor device according to claim 2, in which when a forward current with a current density $J_F$ is passed between said first and second electrodes, the relation $$1.00 \leq \frac{q}{kT} \frac{\partial V_F}{\partial (\ln J_F)} \leq 1.15$$

is established in a forward voltage $V_F$ range of 0.1 (V) to 0.3 (V), where k represents the Boltzmann constant, q represents the quantity of electron charges, and T represents the absolute temperature.

4. A semiconductor device according to claim 2, in which the amount of impurities contained in said fourth semiconductor region is not larger than $1 \times 10^{14}$ cm$^{-2}$.

5. A semiconductor device according to claim 3, in which the amount of impurities contained in said fourth semiconductor region is not larger than $1 \times 10^{14}$ cm$^{-2}$.

6. A semiconductor device according to claim 2, in which the thickness of sad fourth semiconductor region is not larger than 100 nm.

7. A semiconductor device according to claim 3, in which the thickness of said fourth semiconductor region is not larger than 100 nm.

8. A semiconductor device according to claim 4, in which the thickness of said fourth semiconductor region is not larger than 100 nm.

9. A semiconductor device according to claim 5, in which the thickness of said fourth semiconductor region is not larger than 100 nm.

10. A semiconductor device comprising:
    a first semiconductor region of one conductive type;
    a second semiconductor region of the other conductive type extending from one surface of said first semiconductor region into the inside of said first semiconductor region so as to form small areas and an annular area surrounding said small areas when seen from said one surface and having an impurity concentration higher than that of said first semiconductor region;

a third semiconductor region of the other conductive type extending from said one surface of said first semiconductor region into the inside of said first semiconductor region so as to be located on portions of said first semiconductor region which are exposed among said small and annular areas of said second semiconductor region, said third semiconductor region having a thickness thinner than that of said second semiconductor region and having an impurity concentration lower than that of said second semiconductor region;

a fourth semiconductor region of the one conductive type provided so as to be adjacent to said first semiconductor region at an opposite side to said one surface, said fourth semiconductor region partly extending to said one surface so as to be exposed at said one surface and having an impurity concentration higher than that of said first semiconductor region;

a first electrode provided so as to be in ohmic contact with said second semiconductor region and so as to be in contact through a Schottky barrier with said third semiconductor region; and a second electrode provided so as to be in ohmic contact with the portion of said fourth semiconductor region which is exposed at said one surface.

11. A semiconductor device according to claim 10, in which when a forward current with a current density $J_F$ is passed between said first and second electrodes, the relation $$1.00 \leq \frac{q}{kT} \frac{\partial V_F}{\partial (\ln J_F)} \leq 1.15$$

is established in a forward voltage $V_F$ range of 0.1 (V) to 0.3 (V), where k represents the Boltzmann constant, q represents the quantity of electron charges, and T represents the absolute temperature.

12. A semiconductor device according to claim 10, in which the amount of impurities contained in said third semiconductor region is not larger than $1 \times 10^{14}$ cm$^{-2}$.

13. A semiconductor device according to claim 11, in which the amount of impurities contained in said third semiconductor region is not larger than $1 \times 10^{14}$ cm$^{-2}$.

14. A semiconductor device according to claim 10, in which the thickness of said third semiconductor region is not larger than 100 nm.

15. A semiconductor device according to claim 11, in which the thickness of said third semiconductor region is not larger than 100 nm.

16. A semiconductor device according to claim 12, in which the thickness of said third semiconductor region is not larger than 100 nm.

17. A semiconductor device according to claim 13, in which the thickness of said third semiconductor region is not larger than 100 nm.

18. A semiconductor device according to claim 10, in which said first, second, third and fourth semiconductor regions are formed in one of a plurality of semiconductor single crystal regions which are provided in an integrated-circuit substrate so as to be electrically isolated from one another.

19. A semiconductor device according to claim 11, in which said first, second, third and fourth semiconductor regions are formed in one of a plurality of semiconductor single crystal regions which are provided in an integrated-circuit substrate so as to be electrically isolated from one another.

20. A semiconductor device according to claim 12, in which said first, second, third and fourth semiconductor regions are formed in one of a plurality of semiconductor single crystal regions which are provided in an integrated-circuit substrate so as to be electrically isolated from one another.

21. A semiconductor device according to claim 13, in which said first, second, third and fourth semiconductor regions are formed in one of a plurality of semiconductor single crystal regions which are provided in an integrated-circuit substrate so as to be electrically isolated from one another.

22. A semiconductor device according to claim 14, in which said first, second, third and fourth semiconductor regions are formed in one of a plurality of semiconductor single crystal regions which are provided in an integrated-circuit substrate so as to be electrically isolated from one another.

23. A semiconductor device according to claim 15, in which said first, second, third and fourth semiconductor regions are formed in one of a plurality of semiconductor single crystal regions which are provided in an integrated-circuit substrate so as to be electrically isolated from one another.

24. A semiconductor device according to claim 16, in which said first, second, third and fourth semiconductor regions are formed in one of a plurality of semiconductor single crystal regions which are provided in an integrated-circuit substrate so as to be electrically isolated from one another.

25. A semiconductor device according to claim 17, in which said first, second, third and fourth semiconductor regions are formed in one of a plurality of semiconductor single crystal regions which are provided in an integrated-circuit substrate so as to be electrically isolated from one another.

* * * * *

UNITED STATES PATENT AND TRADEMARK OFFICE
CERTIFICATE OF CORRECTION

PATENT NO.    : 5,101,244
DATED         : March 31, 1992
INVENTOR(S)   : M. Mori et al.

Page 1 of 1

It is certified that error appears in the above-identified patent and that said Letters Patent is hereby corrected as shown below:

Column 10,
Line 19, delete the word "and".
Line 31, change the word "third" to -- fourth --.
Line 52, change the word "sad" to -- said --.

Signed and Sealed this

Tenth Day of June, 2003

JAMES E. ROGAN
*Director of the United States Patent and Trademark Office*